United States Patent [19]

Ogitani et al.

[11] Patent Number: 4,997,863

[45] Date of Patent: Mar. 5, 1991

[54] THERMOSETTING RESIN COMPOSITION USEFUL FOR FORMING INSULATING LAYER OF MULTILAYER PRINTED WIRING BOARD

[75] Inventors: Osamu Ogitani; Takashi Shimizu, both of Koshigaya; Ryuichi Fujii, Urawa, all of Japan

[73] Assignee: Somar Corporation, Japan

[21] Appl. No.: 397,791

[22] Filed: Aug. 24, 1989

[30] Foreign Application Priority Data

Aug. 26, 1988 [JP] Japan .................... 63-212714

[51] Int. Cl.$^5$ .................... C08K 7/00; C08K 3/36; C08K 3/34
[52] U.S. Cl. .................... 523/220; 523/440; 523/443; 523/466
[58] Field of Search ............... 523/220, 440, 443, 466

[56] References Cited

FOREIGN PATENT DOCUMENTS 61-215615 9/1986 Japan .................... 523/466
63-297420 12/1988 Japan .................... 523/466

Primary Examiner—Lewis T. Jacobs
Assistant Examiner—U. K. Rajguru
Attorney, Agent, or Firm—Lorusso & Loud

[57] ABSTRACT

A thermosetting resin composition suitable for forming an insulating layer to be interposed between two adjacent wiring patterns of a multilayer printed circuit board is disclosed which includes an aromatic epoxy resin having at least two epoxy groups, an aromatic polyamine mica having an average particle size of 50 $\mu$m or less, and silica having an average particle size of 20 $\mu$m or less, the average particle size of the silica being smaller than that of the mica, and the amount of the silica being 20–80% based on the total weight of the silica and the mica.

5 Claims, 1 Drawing Sheet

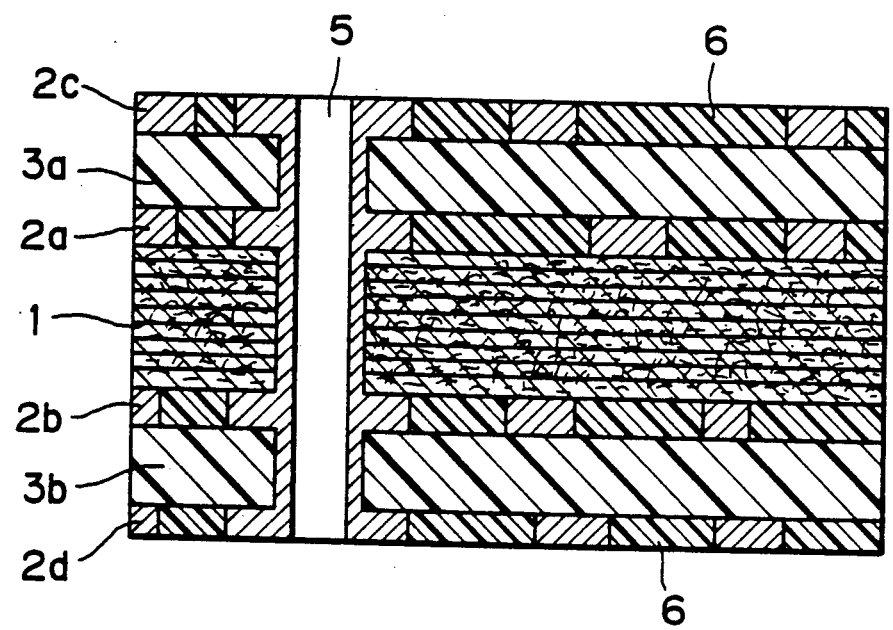

THERMOSETTING RESIN COMPOSITION USEFUL FOR FORMING INSULATING LAYER OF MULTILAYER PRINTED WIRING BOARD

This invention relates to a thermosetting resin composition useful for forming an insulating layer to be interposed between two adjacent wiring patterns of a multilayer printed wiring board.

One well known method for preparing multilayer printed circuit boards is a so-called build-up method in which a resin coating liquid is applied over a surface of a first wiring pattern of a printed wiring board to form an insulating layer, and a second wiring pattern is thereafter formed by chemical plating over the insulating layer.

One problem associated with the build-up method is that the printed wiring board tends to be warped when the insulating layer is coated thereover. The warp of the board causes difficulties in forming a plating-resist layer with a uniform thickness thereon by screen printing which is performed prior to the chemical plating. Thus, it is important that the resin coating liquid for the formation of the insulating layer should not cause shrinkage during its curing stage in order to prevent warp of the board. Warp of the board also causes a difficulty in the formation of another insulating layer of a uniform thickness by a screen printing method or a roll coating method, when a further wiring pattern is intended to be provided.

Such an insulating layer should also exhibit satisfactory resistance to voltage, heat and chemicals and good electrically insulating properties. The chemical resistance is required in the chemical plating stage for the fabrication of the multilayer printed wiring boards while the heat resistance is required in soldering stage of the boards for mounting electric parts thereon. The term "resistance to voltage impression" used in the present specification is intended to refer to interlayer electrical insulating property.

It has been found that even when a thermosetting resin which exhibits, upon being cured, excellent electrically insulating property is used for the formation of an insulating layer interposed between two wiring patterns of a multilayer printed wiring board, short circuit between the two wiring patterns sometimes occurs. According to the investigation by the present inventors, such short circuit is considered to result from defects, such as a pin hole, of the insulating layer.

It is, therefore, the prime object of the present invention to provide a thermosetting resin composition which does not cause warp of a board and which affords an insulating layer having excellent resistance to voltage impression, heat and chemicals and good electrically insulating property.

In accordance with one aspect of the present invention there is provided a thermosetting resin composition comprising:
an aromatic epoxy resin having at least two epoxy groups;
an aromatic polyamine;
mica having an average particle size of 50 μm or less; and
silica having an average particle size of 20 μm or less, the average particle size of the silica being smaller than that of the mica, and the amount of the silica being 20–80 % based on the total weight of the silica and the mica.

In another aspect the present invention provides a multilayered printed wiring board comprising a wiring board having a first wiring pattern on the surface thereof, an insulating layer provided to cover the first wiring pattern, and a second wiring pattern provided on the surface of the insulating layer, said insulating layer being formed of a cured product of the above thermosetting resin composition.

The present invention will now be described in detail below with reference to the accompanying drawing in which the sole FIGURE is a partial, cross-sectional view diagrammatically showing an example of a multilayer printed wiring board embodying the present invention.

The aromatic epoxy resin having at least two epoxy groups may be, for example, (a) an epi-bis epoxy resin obtained by reacting a bisphenol compound such as bisphenol A, bisphenol S or bisphenol F with epichlorohydrin in the presence of an alkali, and (b) a phenol novolak resin obtained by reacting a phenol compound such as phenol, cresol or bisphenol A with an aldehyde such as formaldehyde in the presence of an acid catalyst, followed by reaction with epichlorohydrin in the presence of a alkali. Illustrative of suitable epi-bis epoxy resins (a) are Epikote #807 and #828 manufactured by Yuka-Shell Epoxy Inc. Illustrative of suitable novolak resins (b) are Epikote #152 and #154 manufactured by Yuka-Shell Epoxy Inc. and DEN #431 and #438 manufactured by Dow Chemical Inc.

The aromatic polyamine serves to function as a curing agent for the above epoxy resin and may be, for example, an aromatic diamine such as methaphenylenediamine, diaminodiphenylmethane, diaminodiphenylsulfone or a eutectic mixture thereof. Epicure Z (manufactured by Yuka-Shell Epoxy Inc.) and Kayahard A-A (manufactured by Nihon Kayaku K. K.) are suitable examples of such diamines. The aromatic polyamine is preferably used in an amount so that the ratio of equivalents of the active hydrogen of the polyamine to equivalents of the epoxy group of the epoxy resin is in the range of 0.7–1.3, more preferably 0.85–1.15, for reasons of good bonding force of the thermosetting resin composition after curing.

Both hard mica and soft mica may be used for the purpose of the present invention. The mica has an average particle size of 50 μm or less, preferably 1–40 μm. Illustrative of suitable mica are hard mica C-3000 (manufactured by Shiraishi Kogyo K. K.) and soft mica S-325B (manufactured by Repco Inc.).

Silica to be used in conjunction with the above mica may be fused silica, amorphous silica or surface-treated silica. Surface treated silica may be, for example, silica particles surface-treated with a silane coupling agent, a titanate or a silicone resin. The average particle size of the silica should smaller than that of the mica and is 20 μm or less, preferably 0.1–10 μm. Illustrative of suitable silica are IMSIL A-108 or IMSIL A-10 (manufactured by Tatsumori Inc.).

The amount of the silica in the composition according to the present invention should be 20–80% based on the total weight of the silica and the mica. An amount of the silica below 20% by weight cannot provide satisfactory resistance to voltage impression. When the amount of the silica exceeds 80% by weight, on the other hand, warp of the board is apt to be caused. The amount of silica is preferably 25–75% based on the total weight of the silica and the mica.

The reason why the use of mica in conjunction with silica can improve resistance to voltage is unknown. Presumably, the presence of silica facilitates orientation of scale-form mica in parallel to the insulating layer so that the insulating layer can withstand an electrical voltage impressed in the direction normal thereto.

The total weight of the mica and the silica in the thermosetting resin composition of the present invention is preferably 5-80%, more preferably 10-75% based on the total weight of the aromatic epoxy resin and the aromatic polyamine. Too small an amount of the mica and silica causes warp of the board while too large an amount thereof tends to cause difficulty in coating of the resin composition.

The thermosetting resin composition may further contain a variety of other components such as a viscosity controlling agent, a flame retardant, an auxiliary flame retardant, a curing promoter, a leveling agent, a dye, a pigment and antifoaming agent. As a viscosity controlling agent, there may be used a reactive diluent containing an epoxy group, such as butyl glycidyl ether, phenyl glycidyl ether, 1,6-hexanediol diglycidyl ether, trimethylolpropane triglycidyl ether or a brominated phenyl glycidyl ether having a bromine content of 40-50% by weight. The last mentioned brominated compound also serves to function as a flame retardant.

In use, the above thermosetting resin composition is applied on the surface of a printed pattern of a wiring board by a suitable coating method such as flow coating, roll coating or screen printing, followed by curing to form an insulating layer over the printed pattern. The curing may be performed at a temperature of 100°-200° C. for 30-300 minutes. The insulating layer generally has a thickness of 20-500 μm, preferably 50-400 μm. Another wiring pattern is then formed on the insulating layer by chemical plating in the conventional manner, thereby to obtain a multilayer printed wiring board.

An example of such a multilayer printed wiring board is shown in the accompanying drawing. Designated as 1 is a board having two wiring patterns 2a and 2b on the both sides thereof. Provided over the wiring patterns 2a and 2b are insulating layers 3a and 3b, respectively, obtained by coating and curing the thermosetting resin composition according to the present invention. Two outermost wiring patters 2c and 2d are formed on the insulating layers 3a and 3b by chemical plating. Designated as 5 is a through hole for insertion of a lead wire of an electrical part and as 6 is a plating resist.

The following examples will further illustrate the present invention.

EXAMPLE 1

First and second agents having the composition shown in Table 1 were prepared. 100 Parts by weight of the first agent were then mixed with the second agent in an amount shown in Table 1 and the resulting mixture (coating liquid) was tested for gel time, resistance to voltage, warp, electrical insulating property and resistance to heat. In the tests, the curing of the mixture was performed in a two stage manner at 120° C. for 40 minutes and at 170° C. for 60 minutes. The test results are shown in Table 1.

EXAMPLE 2 AND COMPARATIVE EXAMPLES 1-3

Example 1 was repeated in the same manner as described using the components shown in Table 1. The test results are shown in Table 1

The components shown in Table 1 are as given below:

Epikote 828: Bisphenol A epoxy resin, epoxy equivalent: 184–194, manufactured by Yuka-Shell Epoxy Inc.

Epikote 152: Phenol novolak epoxy resin, manufactured by Yuka-Shell Epoxy Inc.

Mica C-3000: Average particle size: 7 μm, manufactured by Shiraishi Kogyo Inc.

Silica A-10: Surface treated silica IMSIL A-10 (H), average particle size: 1.55 μm, manufactured by Tatsumori Inc.

Silica A-108: Silica IMSIL A-108, average particle size: 1.22 μm, manufactured by Tatsumori Inc.

Diluent: 1,6-Hexanediol diglycidyl ether

BROC: Brominated phenyl glycidyl ether, manufactured by Nihon Kayaku K. K.

Auxiliary flame retardant: $Sb_2O_3$

Curing agent 1: 4,4'-diamino-3,3'diethyldiphenylmethane, KAYAHARD AA, manufactured by Nihon Kayaku K. K.

Curing agent 2: eutectic mixture containing m-phenylenediamine and diaminodiphenylmethane, EPICURE Z, manufactured by Yuka-Shell Epoxy Inc.

The test methods are as follows:

Gel time test:

The coating liquid is maintained at 150° C. The period of time from the start of heating until the liquid has gelled is measured.

Resistance to voltage impression test:

The coating liquid is applied by screen printing to a copper layer of a copper clad, glass wool/epoxy resin board (MEL manufactured by Toshiba Chemical K. K.) and cured to obtain a layer having a thickness shown in Table 1. On the resulting cured layer is placed an electrode having a diameter of 10 mm and a direct current (100 V) is charged between the copper layer and the electrode to measure whether or not current is transmitted therebetween. Similar measurement is repeapted at 500 different positions of the cured layer. Voltage resistance is evaluated as follows:

Good: No current transmission is observed in any of the 500 measurements

Poor: Current transmission is observed in one or more of the 500 measurements

Warp test:

The coating liquid is applied over one side of a board (ACL-147F manufactured by Hitachi Kasei Kogyo K. K.) having a size of 500×300 mm and cured to obtain a layer having a thickness shown in Table 1. The board having the cured layer is then placed on a flat table at room temperature. The maximum gap between the table and the board is measured. A gap smaller than 5 mm is desirable.

Electrical insulation test:

The coating liquid is applied and cured in the same manner as in the above Voltage Resistance Test. Electrical resistivity is measured in accordance with JIS C 2103.

Heat resistance test:

The coating liquid is applied and cured in the same manner as in the above Voltage Resistance Test. The cured layer is immersed in a solder bath at 260° C. for 10 minutes. Heat resistance is evaluated as follows:

Good: no change is observed

Poor: any change such as blister is observed

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

TABLE 1

|  | Example | | Comparative Example | | |
|---|---|---|---|---|---|
|  | 1 | 2 | 1 | 2 | 3 |
| First Agent (parts by weight) | | | | | |
| Epikote 828 | 90 | | 90 | 90 | |
| Epikote 152 | | 60 | | | 60 |
| Mica C-3000 | 15 | 35 | 50 | | 45 |
| Silica A-10 | 35 | | | 50 | |
| Silica A-108 | | 15 | | | 5 |
| Diluent | | 30 | | | 30 |
| BROC | 10 | 10 | 10 | 10 | 10 |
| Auxiliary flame retardant | 1 | 1 | 1 | 1 | 1 |
| Second Agent (parts by weight) | | | | | |
| Curing agent 1 | 22 | | 22 | 22 | |
| Curing agent 2 | | 19 | | | 19 |
| Thickness | 80–100 | 170–200 | 80–100 | 80–100 | 170–200 |
| Properties | | | | | |
| Gel time (min) | 27 | 25 | 25 | 26 | — |
| Voltage resistance | good | good | poor | good | poor |
| Warp (mm) | 4 | 5 | 5 | 17 | 4 |
| Insulation ($\times 10^{11} \Omega$) | 5 | 1 | 2 | 9 | 3 |
| Heat resistance | good | good | good | good | poor |

What is claimed is:

1. A thermosetting resin composition comprising: an aromatic epoxy resin having at least two epoxy groups; an aromatic polyamine; mica having an average particle size of 50 $\mu$m or less; and silica having an average particle size of 20 $\mu$m or less, the average particle size of the silica being smaller than that of the mica, and the amount of the silica being 20–80% based on the total weight of the silica and the mica.

2. A composition according to claim 1, wherein the mica has an average particle size of 1–40 $\mu$m.

3. A composition according to claim 1, wherein the silica has an average particle size of 0.1–10 $\mu$m.

4. A composition according to claim 1, wherein the amount of the silica is 25–75% based on the total weight of the silica and the mica.

5. A composition according to claim 1, wherein the total weight of the mica and the silica is 5–80% based on the total weight of the aromatic epoxy resin and the aromatic polyamine.

* * * * *